United States Patent [19]

Kuroda et al.

[11] Patent Number: 4,498,013
[45] Date of Patent: Feb. 5, 1985

[54] SOLID STATE IMAGE SENSOR EXHIBITING REDUCED IMAGE SMEARING EFFECTS

[75] Inventors: Takao Kuroda, Osaka; Kenju Horii, Shiga; Shigenori Matsumoto, Osaka, all of Japan

[73] Assignee: Matsushita Electric Industrial Co., Ltd., Osaka, Japan

[21] Appl. No.: 363,518

[22] Filed: Mar. 30, 1982

[30] Foreign Application Priority Data

Mar. 30, 1981 [JP] Japan .................................. 56-47834

[51] Int. Cl.³ ............................................ H01L 27/14
[52] U.S. Cl. .................................. 250/578; 250/211 J; 357/24; 357/30
[58] Field of Search ................... 357/24 LR, 30, 24 M; 250/211 J, 578; 358/212, 213

[56] References Cited

U.S. PATENT DOCUMENTS 3,896,474  7/1975  Amelio et al. .................. 357/24 LR
4,373,167  2/1983  Yamada ........................... 357/24 LR Primary Examiner—Edward P. Westin
Attorney, Agent, or Firm—Burgess, Ryan & Wayne

[57] ABSTRACT

The invention provides a solid state image pickup device having a plurality of photoelectric transducers and a vertical transfer CCD (charge coupled device) unit. A concentration of an impurity of a semiconductor substrate region surrounding each of the vertical transfer CCD in the vicinity of each of the photoelectric transducers is higher than that below each of the photoelectric transducers.

5 Claims, 7 Drawing Figures

SOLID STATE IMAGE SENSOR EXHIBITING REDUCED IMAGE SMEARING EFFECTS

BACKGROUND OF THE INVENTION

The present invention relates to a solid state image pickup device. In a conventional solid state image pickup device, the quality of reproduced images is degraded due to a smear phenomenon.

SUMMARY OF THE INVENTION

It is an object of the present invention to eliminate the smear phenomenon wherein an electric charge which becomes a noise component is generated by an incident light beam in a substrate and the electric charge is mixed with a signal component so that degradation of the quality of a reproduced image may be prevented and an excellent image may be produced.

In order to achieve the above object of the present invention, there is provided a solid state image pickup device having photoelectric transducers and signal readout means, wherein a concentration of an impurity in a substrate region which surrounds the readout means adjacent to the photoelectric transducers is higher than that in a substrate region under the photoelectric transducers.

DETAILED DESCRIPTION OF THE PRIOR ART

A CCD-type solid state image pickup element of an interline transfer system has a photodiode (to be referred to as a PD for brevity hereinafter) as a photoelectric transducer formed on a p-type substrate and an n-channel buried channel CCD (charge coupled device) as a vertical transfer shift register (to be referred to as a V-CCD hereinafter). The smear phenomenon will be described with reference to the solid state image pickup element of this type.

Figure 1:
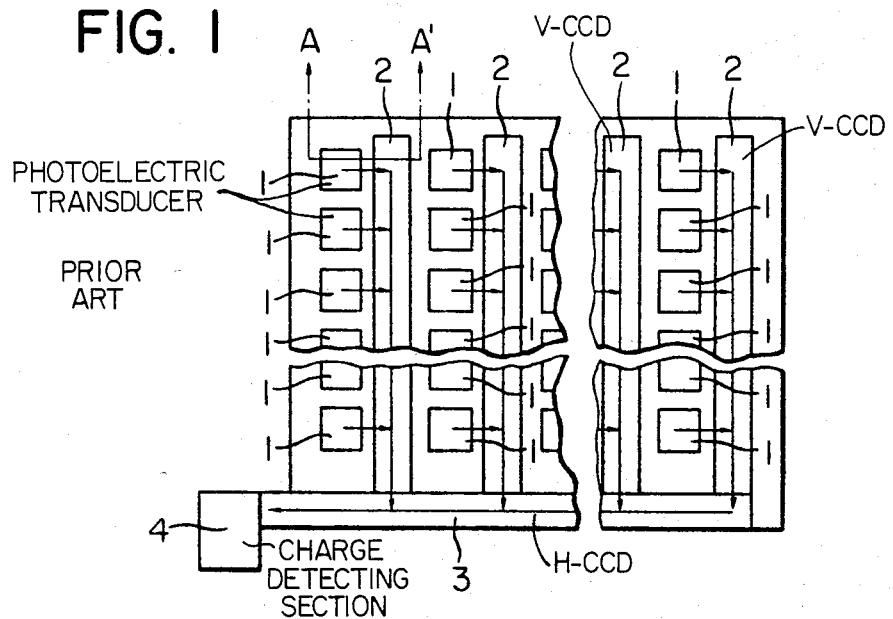
FIG. 1 is a view showing the basic arrangement of a CCD-type solid state image pickup element of an interline transfer system to explain the mode of operation thereof.

FIG. 1 shows the arrangement of the CCD-type solid state image pickup element of the interline transfer system. Light beams are radiated on photoelectric transducers 1 and electric charge generated thereby is supplied to V-CCDs 2 as indicated by an arrow. This electric charge is then supplied to horizontal transfer CCDs 3 (to be referred to as H-CCDs hereinafter) and a charge detecting section 4. The charge detecting section 4 detects the electric charge and generates a signal.

The basic mode of operation of the solid state image pickup element is described above. However, during transmission of the electric charge corresponding to the signal, an electric charge is generated by the incident light beams in the substrate and part of the charge is supplied to the V-CCDs 2 and causes the noise component. When the incident light beam is intense, the amount of the electric charge which is the noise component is increased. Therefore, the amount of the electric charge supplied to the V-CCDs 2 is also increased. As a result, white streaks appear above and below the part on which the intense light beam is radiated, thus degrading quality of the image on the screen. This is the so-called smear phenomenon.

Figure 2A:
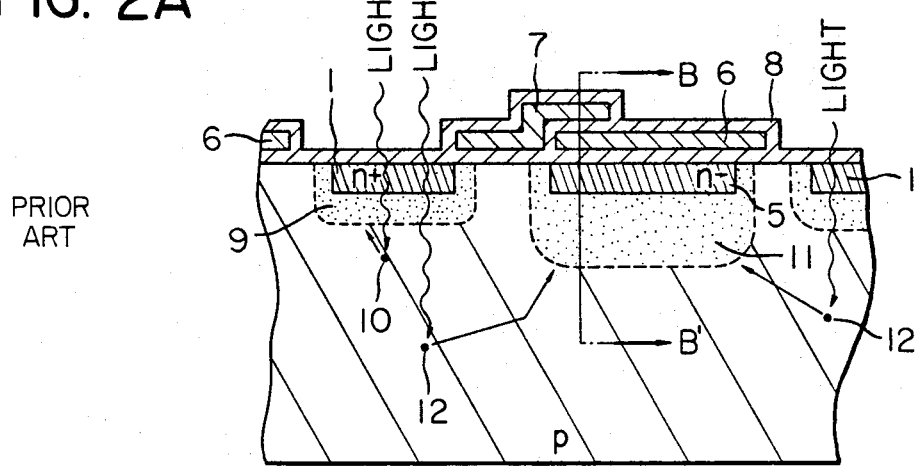
FIGS. 2A and 2B are respectively a sectional view of a conventional solid state image pickup element to explain the mechanism of smear phenomenon, and a graph showing the potential profile as a function of the depth of a substrate.
Figure 2B:
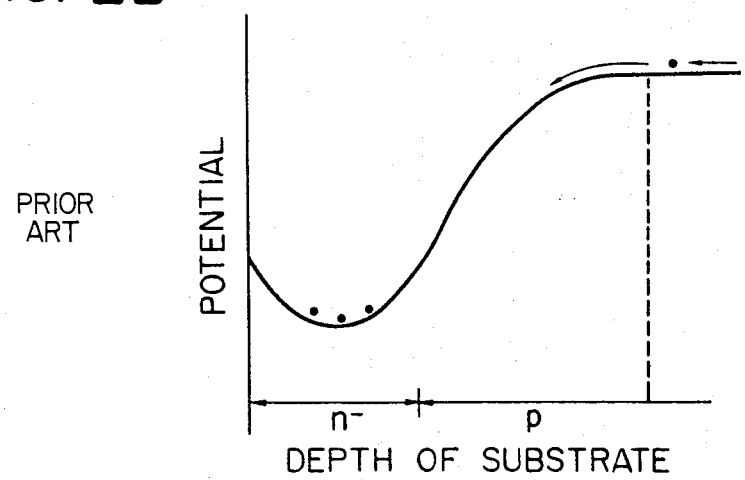

This phenomenon is described with reference to the sectional view of FIG. 2A along the line A—A of FIG. 1. Referring to FIG. 2A, reference numeral 5 denotes a channel of the V-CCD; 6, a transfer electrode of the V-CCD; 7, a transfer gate electrode; 8, a silicon dioxide layer; 9, a depletion layer of the photoelectric transducer (PD)1; 10, a signal charge; 11, a depletion layer of the channel of the V-CCD; and 12, a smear charge. The electric charge generated deep in a photodiode PD1 in response to the incident light beam includes the signal charge 10 which is supplied to the depletion layer 9 of the PD1 and collected therein and the smear charge 12 which is generated in the p-type substrate and supplied to the depletion layer 11 of the V-CCD. This smear charge 12 causes the smear phenomenon. FIG. 2B is a graph of the potential profile along the line B—B' of FIG. 2A. This graph shows the state in which the smear charge 12 migrates to the depletion layer 11. When the light beam is radiated in a steady state, the smear charge 12 is generated steadily and supplied to the depletion layer 11, thus degrading the reproduced image on the screen since the smear charge 12 is output together with the signal charge 10.

Since the electric charge is supplied steadily in the V-CCD near the PD 1 on which the intense light beam is radiated, the charge is equally mixed in every bit of the signal transferred through the V-CCD. Therefore, vertical white streaks appear on the screen, thus degrading the quality of the reproduced image.

DESCRIPTION OF THE PREFERRED EMBODIMENTS

Figure 3A:
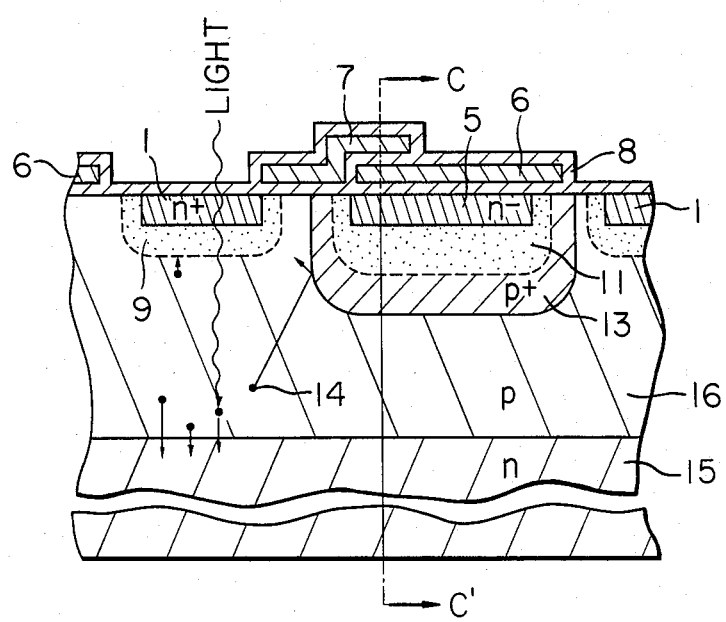
FIGS. 3A and 3B are respectively a sectional view for explaining the mode of operation of a solid state image pickup element, and a graph showing the potential profile as a function of the depth of a substrate, according to one embodiment of the present invention.
Figure 3B:
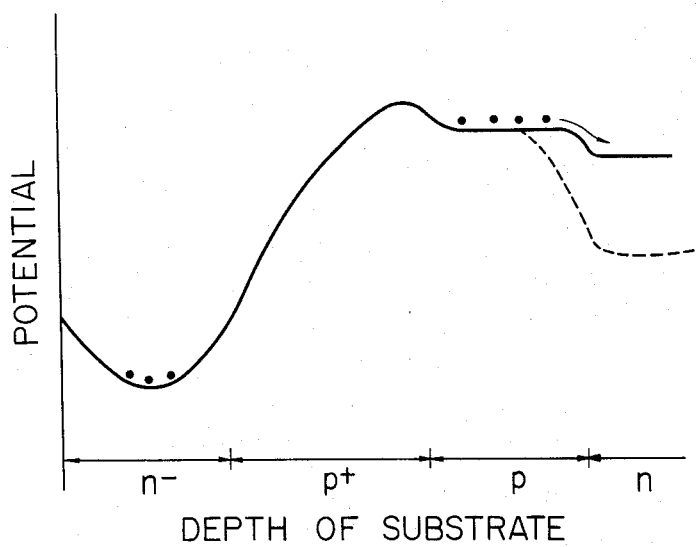

A solid state image pickup device according to one embodiment of the present invention will be described with reference to FIGS. 3A and 3B. FIG. 3A is a sectional view of the solid state image pickup device. The channel 5 is covered with a p$^+$-type layer 13 the impurity concentration of which is higher than that of a p-type layer 16. The p-type layer 16 is formed on an n-type substrate 15. The solid state image pickup element of FIG. 3A is the same as that of FIG. 2A except for the above structural arrangements.

With the solid state pickup device of the above structure, the potential of the p$^+$-type layer 13 relative to electrons is higher than that of the p-type layer 16. An electric charge 14 which becomes the noise component and which is generated in the p-type layer 16 may hardly be introduced to the depletion layer 11 of the V-CCD. This is because a potential barrier against the charge 14 is formed around the depletion layer 11 of the V-CCD. In this embodiment, since the p-type layer 16 is formed on the n-type substrate 15, an electric charge is discharged to the n-type substrate 15 even if the incident light is very intense. Thus, the smear phenomenon can be further prevented. FIG. 3B is a graph of the potential profile when taken along the line C—C of FIG. 3A. If a reverse bias voltage is applied between the p-type layer 16 and the n-type substrate 15, the potential profile is changed as indicated by the broken line of FIG. 3B. Thus, excessive charge can be discharged effectively.

Figure 4:
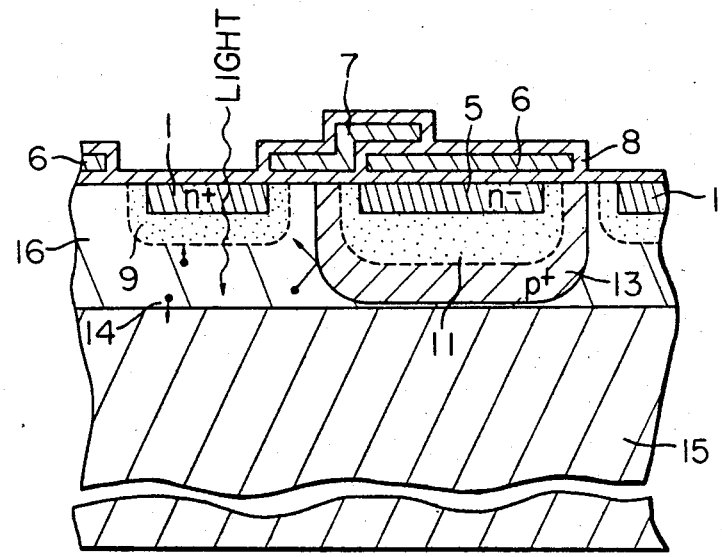
FIGS. 4 and 5 are sectional views of a solid state image pickup element according to another embodiment of the present invention.

In order to discharge the smear charge 12 generated in the p-type layer 16 to the n-type substrate 15 in a great amount, the p-type layer 16 under the photoelectric transducer 1 must be made thinner. FIG. 4 shows a structure wherein the p-type layer 16 is made thin and the n-type substrate layer 15 is in contact with the $p^{30}$-type layer according to another embodiment of the present invention.

Figure 5:
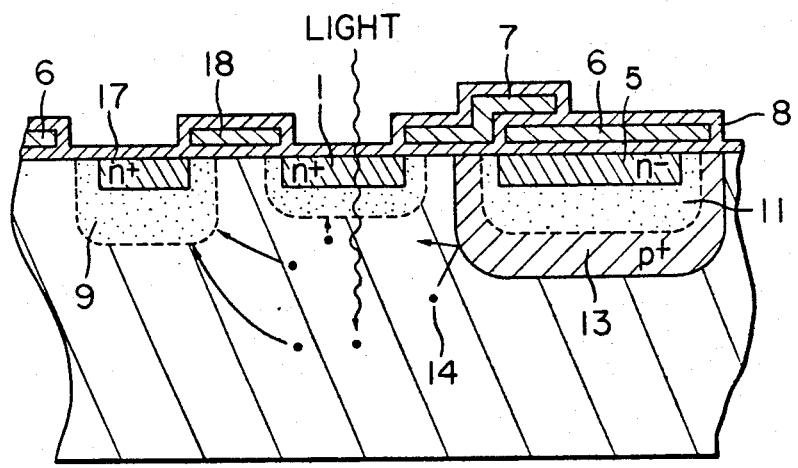

Referring to FIG. 5, an overflow drain 17 for discharging the excess charge in PD1 can also discharge the charge generated in the deep region of the PD1 to the outside, for example through an overflow control gate 18.

Further, if the structure shown in FIG. 5 is formed on the n-type substrate of FIG. 3A, barrier effects are further enhanced.

Above embodiments has been described with reference to the CCD of the interline transfer system. However, the present invention may alternatively be applied to a solid state image pickup element using a MOS (metal oxide semiconductor) switching transistor which serves as signal charge readout means. Further, the pesent invention may also be applied to a BBD (bucket-brigate device) or a one-dimensional solid state image pickup element.

In summary, the solid state image pickup device according to the present invention has a function to prevent the smear phenomenon. Therefore, an excellent image is produced on the screen and the device allows various industrial applications.

What is claimed is:

1. A solid state image pickup device comprising, on a major surface of a semiconductor substrate, a plurality of photoelectric, transducers, signal readout means for reading out a signal charge stored in each of said plurality of photoelectric transducers and an impurity concentration in a first substrate region enclosing said readout means adjacent to said photoelectric transducers and which is higher than an impurity concentration in a second substrate region under said photoelectric transducers.

2. A device according to claim 1, further comprising charge discharging means formed in a region of said semiconductor substrate below said second substrate region.

3. A solid state image pickup device comprising, on a major surface of a semiconductor substrate of one conductivity type, a semiconductor layer of the other conductivity type, said semiconductor layer of the other conductivity type including a plurality of photoelectric transducers; signal readout means for reading out a signal charge stored in each of said plurality of photoelectric transducers; and an impurity concentration, in a first region of said semiconductor layer which encloses said readout means adjacent to said photoelectric transducers, higher than an impurity concentration in a second region of said semiconductor layer under the photoelectric transducers; and a reverse bias voltage is applied between said semiconductor substrate of one conductivity type and said semiconductor layer of the other conductivity type.

4. A solid state image pickup device comprising a plurality of photoelectric transducers, signal readout means for reading out a signal charge stored in each of said plurality of photoelectric transducers on a major surface of a semiconductor substrate, an impurity concentration in a first substrate region which encloses said readout means adjacent to said photoelectric transducers higher than an impurity concentration in a second substrate region under said photoelectric transducers, and an overflow drain adjacent said photoelectric transducers for discharging excess charge formed in said second substrate region.

5. A solid state image pickup device comprising, impurity regions formed on a major surface of a semiconductor substrate of one conductivity type, and being of the other conductivity type and which form a plurality of photoelectric transducers which produce a signal charge in response to light energy, said plurality of photoelectric transducers being aligned in a first direction on said substrate; vertical transfer regions formed on said substrate by impurity regions of the other conductivity type which transfer the signal charge converted by said plurality of photoelectric transducers in the vertical direction; horizontal transfer regions formed on said substrate for transferring the signal charge in said vertical transfer regions to an output section; gate electrodes respectively formed on said substrate between said plurality of photoelectric transducers and said vertical transfer regions; and a region of said one conductivity type having an impurity concentration which is higher than an impurity concentration of said semiconductor substrate of said one conductivity type below said plurality of photoelectric transducers and which enclose each of said vertical transfer regions.

* * * * *